US008063672B2

(12) United States Patent  (10) Patent No.: US 8,063,672 B2
Balakrishnan  (45) Date of Patent: Nov. 22, 2011

(54) METHOD AND APPARATUS FOR SIMPLIFYING THE CONTROL OF A SWITCH

(75) Inventor: Balu Balakrishnan, Saratoga, CA (US)

(73) Assignee: Power Integrations, Inc., San Jose, CA (US)

( * ) Notice: Subject to any disclaimer, the term of this patent is extended or adjusted under 35 U.S.C. 154(b) by 352 days.

(21) Appl. No.: 12/268,287

(22) Filed: Nov. 10, 2008

(65) Prior Publication Data

US 2009/0085615 A1   Apr. 2, 2009

Related U.S. Application Data

(60) Continuation of application No. 11/474,163, filed on Jun. 23, 2006, now Pat. No. 7,466,170, which is a division of application No. 10/675,824, filed on Sep. 30, 2003, now Pat. No. 7,091,752.

(51) Int. Cl.
   *H03K 3/00* (2006.01)
(52) U.S. Cl. ......... 327/110; 327/112; 327/423; 327/588
(58) Field of Classification Search .................. 327/110, 327/112, 423, 588
   See application file for complete search history.

(56) References Cited

U.S. PATENT DOCUMENTS

| | | | |
|---|---|---|---|
| 4,208,710 A | 6/1980 | Hazumi et al. | |
| 4,521,725 A | 6/1985 | Phaneuf | |
| 4,553,082 A | 11/1985 | Nesler | |
| 4,727,308 A | 2/1988 | Huljak et al. | |
| 4,959,606 A | 9/1990 | Forge | |
| 5,283,477 A | 2/1994 | Shibata | |
| 5,528,125 A | 6/1996 | Marshall et al. | |
| 5,642,065 A * | 6/1997 | Choi et al. | 327/110 |
| 5,717,582 A | 2/1998 | Duong | |
| 5,731,731 A | 3/1998 | Wilcox et al. | |
| 5,808,879 A | 9/1998 | Liu et al. | |
| 5,864,225 A | 1/1999 | Bryson | |
| 5,892,673 A * | 4/1999 | Delgado et al. | 363/98 |
| 5,909,135 A | 6/1999 | Baldwin et al. | |
| 6,002,213 A * | 12/1999 | Wood | 315/307 |
| 6,064,174 A | 5/2000 | Sziebert | |
| 6,268,758 B1 * | 7/2001 | Limmer et al. | 327/424 |

(Continued)

FOREIGN PATENT DOCUMENTS

EP   0851566   12/1997

(Continued)

OTHER PUBLICATIONS

EP 04254350; European Search Report, dated Mar. 13, 2008.

(Continued)

*Primary Examiner* — Kenneth B. Wells
(74) *Attorney, Agent, or Firm* — Blakely Sokoloff Taylor & Zafman LLP (57) ABSTRACT

A technique for simplifying the control of a switch is presented. In one embodiment, a method of controlling a switch as a function of the voltage across the switch is presented. In one embodiment a method of controlling a switch as a function of the slope of the voltage across the switch is present. In one embodiment a switching is switched on for an on time period that is substantially fixed in response to a voltage across the switch while the switch is off. In one embodiment a switch is switched on for an on time period that is substantially fixed in response to the slope of the voltage across the switch while the switch is off.

14 Claims, 7 Drawing Sheets

U.S. PATENT DOCUMENTS

| | | | |
|---|---|---|---|
| 6,421,260 B1 * | 7/2002 | Trevino et al. | 363/98 |
| 6,473,320 B2 | 10/2002 | Randazzo | |
| 6,670,796 B2 | 12/2003 | Mori | |
| 6,710,582 B2 | 3/2004 | Watanabe | |
| 6,809,560 B1 | 10/2004 | Wrathall | |
| 6,828,762 B2 * | 12/2004 | Brkovic | 323/222 |
| 6,873,191 B2 | 3/2005 | Dequina et al. | |
| 6,894,471 B2 | 5/2005 | Corva et al. | |
| 7,030,596 B1 | 4/2006 | Salerno et al. | |
| 7,064,588 B2 * | 6/2006 | Chan et al. | 327/110 |
| 7,091,752 B2 | 8/2006 | Balakrishnan | |
| 7,221,134 B1 | 5/2007 | Ling | |
| 7,307,462 B2 * | 12/2007 | Cheng et al. | 327/175 |
| 7,466,170 B2 | 12/2008 | Balakrishnan | |

FOREIGN PATENT DOCUMENTS

| | | |
|---|---|---|
| EP | 1176707 | 7/2000 |
| JP | 02-196519 | 8/1990 |
| JP | 10-149888 | 6/1998 |
| JP | 2002-209387 | 7/2002 |
| JP | 2003-164152 | 6/2003 |
| JP | 2003-229751 | 8/2003 |
| WO | WO 00/19597 | 4/2000 |
| WO | WO 02/061932 | 8/2002 |

OTHER PUBLICATIONS

EP 04254350; European Search Report dated Jun. 20, 2008.
JP 249923/2004-Japanese Notice of Grounds of Rejection, mailed Oct. 26, 2010, 3 pages.

* cited by examiner

METHOD AND APPARATUS FOR SIMPLIFYING THE CONTROL OF A SWITCH

REFERENCE TO PRIOR APPLICATION

This application is a continuation of and claims priority to U.S. patent application Ser. No. 11/474,163 filed Jun. 23, 2006, now pending, which is a divisional of U.S. application Ser. No. 10/675,824, filed Sep. 9, 2003, now U.S. Pat. No. 7,091,752 B2.

BACKGROUND OF THE INVENTION

1. Field of the Invention

The present invention relates generally to switches and, more specifically, the present invention relates to semiconductor switches that are coupled to control circuits.

2. Background Information

Electronic circuits using switches coupled to control circuits typically have to be designed to meet cost targets defined at the start of a design. The control circuitry used to control the switching of the switches can be a significant part of the electronic circuit cost and any way to reduce the cost of this circuitry is therefore a benefit.

One circuit configuration using switches coupled to control circuits is a power conversion circuit called a half bridge converter. This circuit typically has two switches configured in a half bridge wherein one switch is referred to as a high side switch and the other is referred to as a low side switch as will be known to one skilled in the art.

The control of power delivery to the load in this type of circuit is typically achieved by a control circuit controlling the period of time for which each switch is on within a switching cycle. This on time period is typically controlled in response to a feedback signal received from a sense circuit coupled to the load. The frequency of the switching, being the reciprocal of the time between the start of one on time period and the start of the next on time period of one of the switches, is determined either by an oscillator forming part of the control circuit or a resonant frequency of the load circuitry coupled to the low side and high side switches.

In circuits where the oscillator forms part of the control circuit, turn on and or turn off signals are typically coupled to the high side switch in the half bridge by level shift circuitry, as will be known to one skilled in the art, which adds significant cost to the overall half bridge circuit. In circuits where the frequency of switching is determined by a resonant frequency of the load circuitry coupled to the low side and high side switches, the turn on and or turn off signals can again be coupled to the high side switch by level shift circuitry or using inductively coupled drive signals, which typically sense the current or voltage at the load to determine the time at which to turn on the low side and high side switches.

Since the inductively coupled drive signals can be coupled with separate windings and therefore individually referenced to the low side and high side switch control circuits, the requirement for other level shift circuitry is eliminated. However, the inductively coupled element is required which is coupled to the load and the control circuitry for both low side and high side switches, which again adds cost to the overall half bridge circuit.

In other configurations, inductively coupled drive signals can be used to determine the start of an on time period of either the high side or low side switches and individual oscillators coupled to both low side and high side switches are used to determine the time at which the low side or high side switches are turned off. Again, in these configurations, an inductively coupled drive circuit and an oscillator or timing circuit is required for both high side and low side switches, which adds cost. The same limitations apply to full bridge circuits and other configurations requiring a high side switch.

SUMMARY OF THE INVENTION

A method and apparatus for simplifying the control of a switch is disclosed. In one embodiment, a circuit according to the teachings of the present invention includes a first switch coupled between an input and a load. The circuit also includes a control circuit coupled to the first switch. The control circuit is adapted to control the first switch as a function of a voltage across the first switch. In another embodiment, a half bridge circuit according the teachings of the present invention includes a low side switch, a high side switch coupled to the low side switch, a low side capacitor coupled to the low side switch, a high side capacitor coupled to the low side capacitor and the high side switch and a load connected between a junction between the low side switch and high side switch and a junction between the low side capacitor and the high side capacitor. The high side switch is adapted to be turned on for a high side on time period when a voltage across the high side switch crosses below a threshold in response the low side switch turning off. The low side switch is adapted to be turned on for a low side on time period following a delay time after a voltage across the low side switch crosses below the threshold in response to the high side switch turning off. In yet another embodiment, a circuit according to the teachings of the present invention includes a switching circuit coupled to a load for applying a voltage of a first polarity across the load during a first on time period and applying a voltage of the opposite polarity during a second on time period. The circuit also includes a sensing circuit coupled to load for sensing the voltage across the load for a first sense period during the first on period and for a second sense period during the second on period. The switching circuit is controlled to maintain a magnitude of the voltage across the load during the first on period substantially equal to the voltage across the load during the second on period. Additional features and benefits of the present invention will become apparent from the detailed description, figures and claims set forth below.

BRIEF DESCRIPTION OF THE DRAWINGS

The present invention detailed illustrated by way of example and not limitation in the accompanying figures.

DETAILED DESCRIPTION

A novel technique to implement a simplified control circuit to control a switch is disclosed. In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

In general, a simple and novel technique for controlling the switching of a switch is provided according to embodiments of the present invention. In one embodiment the switch is turned on for an on time period in response to a voltage across the switch while the switch is off or in response to the slope of the voltage across the switch while the switch is off. In one embodiment, the on time period of the switch is substantially fixed. In an embodiment where the switch is a high side switch, the switch is turned on in response to a voltage across the switch while the switch is off or in response to the slope of the voltage across the switch while the switch is off. In controlling the switching of a switch in this way, complex circuitry normally required for this control is eliminated reducing the cost of the circuitry required to perform this function.

Figure 1:
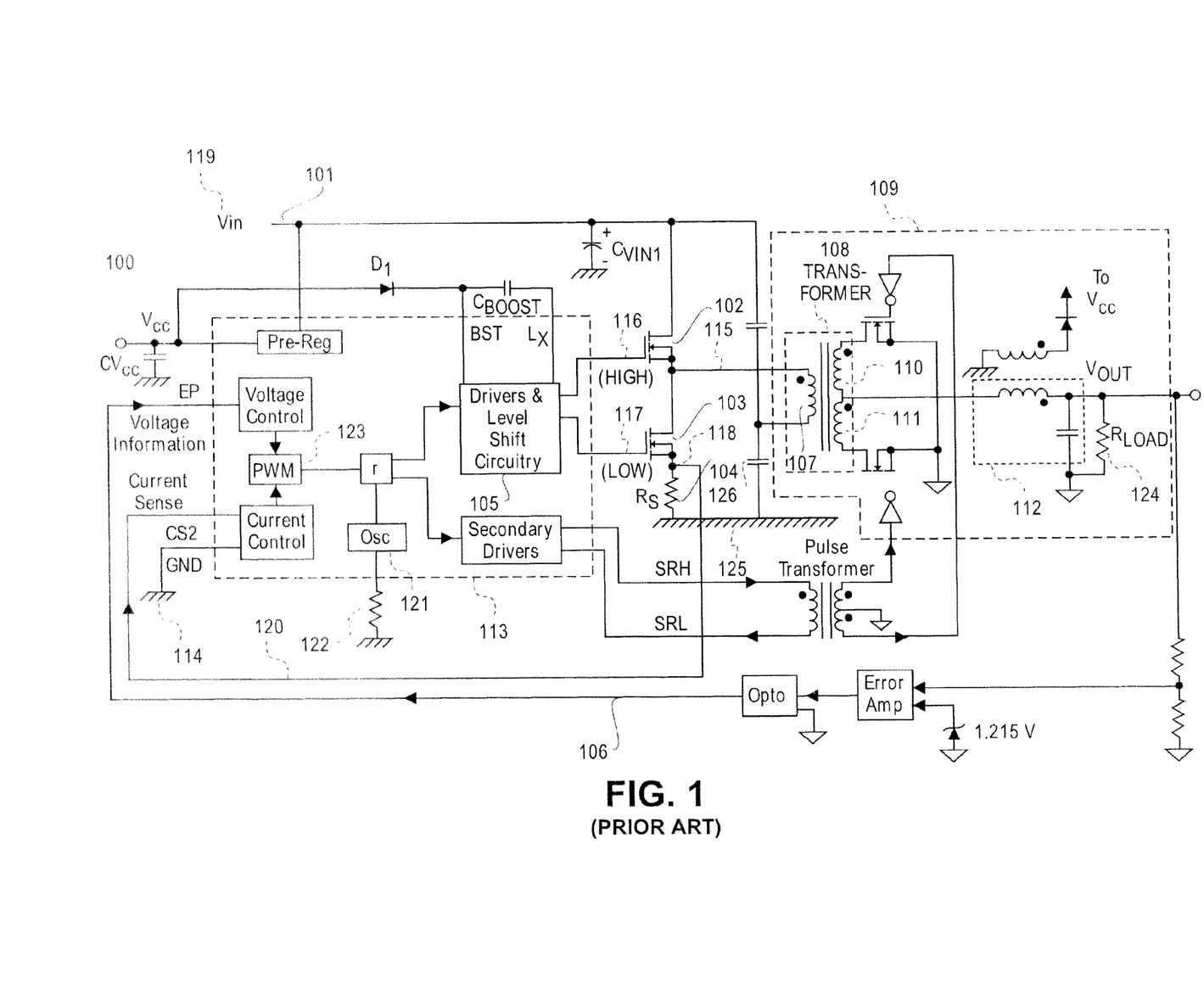
FIG. 1 is a schematic illustrating a half bridge circuit where the drive signals for the high side switch are coupled to the high side switch by level shift circuitry.

To illustrate, FIG. 1 shows a schematic of a power conversion circuit 100 using a half bridge configuration. Control circuit 113 is coupled to both high side switch 102 and low side switch 103 which are both metal oxide semiconductor field effect transistors (MOSFETs) in the circuit of FIG. 1. Switch 102 is referred to as a high side switch since it is coupled to the high side or positive input rail 101 and the load 109. It is coupled to low side return or ground rail 125 through the low side switch 103 or the load 109 and low side half bridge capacitor 126. To turn MOSFET 103 on and off, the gate 117 of MOSFET 103 is driven with respect to its source terminal 118, which is coupled to ground 114 through current sense resistor 104. However, the gate 116 of MOSFET 102 is driven with respect to the half bridge output terminal 115, which is substantially at the Vin voltage 119 with respect to ground 114 when switch 102 is on and switch 103 is off. The driver and level shift circuit 105 therefore contains driver circuitry to drive the gates 116 and 117 of switches 102 and 103 respectively and also level shift circuitry to generate a drive signal relative to the half bridge output terminal 115, is applied to the gate 116 of MOSFET 102. The operating frequency, which is the reciprocal of the time between the start of one on time period to the start of the next on time period of either switch 102 or 103, is fixed by oscillator 121. The frequency of oscillator 121 is set by resistor 122. The on time periods of switches 102 and 103 are not fixed and are determined based on feedback voltage signal 106 and current sense signal 120 which are coupled to control pulse width modulator (PWM) circuit 123. By varying the on time, the power delivered to the load 109 is regulated.

Within the load circuit 109 is the transformer 108, which includes primary or input winding 107 and secondary or output windings 110 and 111. Circuit 112 at the output terminal Vout of power conversion circuit 100 filters the output, which is necessary since with the PWM control scheme of control circuit 113, the on time periods, and therefore also the off time periods, of switches 102 and 103 will vary depending on the output load represented by resistor 124. The varying off time periods of switches 102 and 103 would result in high output ripple voltages if filter circuit 112 was not present. Other aspects of the converter circuit 100 operation, necessary for the correct operation but not critical to the disclosure of the present invention are not discussed.

Figure 2:
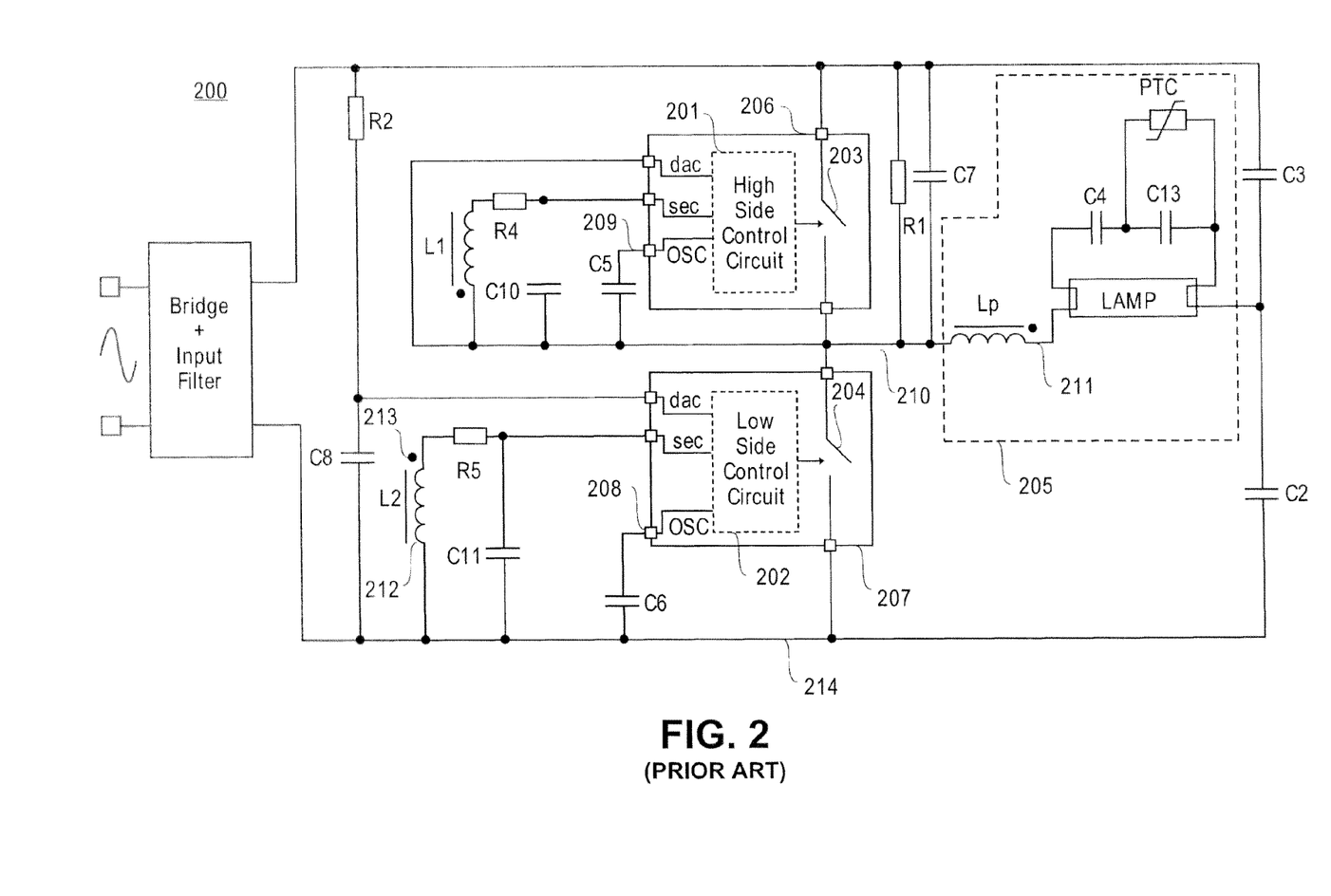
FIG. 2 is a schematic illustrating a half bridge circuit where the drive signals for the high side and low side switches are coupled to the high side and low side switches by an inductively coupled drive circuit

FIG. 2 shows another schematic of a power conversion circuit 200 using a half bridge configuration. The load 205 is in this example is a lamp with a series coupled inductance Lp. In this example, the high side and low side control circuits 201 and 202 and switches 203 and 204 are integrated in separate high side and low side integrated circuits 206 and 207 respectively. The configuration shown eliminates the need for level shift circuitry by using drive signals generated by windings L1 and L2 that are magnetically coupled to Lp, to control the turn on of switches 203 and 204 respectively.

The integrated circuits 206 and 207 use external capacitors C5 and C6 to determine the length of the on time period of the switches. Taking the integrated circuit 206 as an example, during the on time period of high side switch 203, the capacitor C5 is charged with a fixed current. When the voltage across C5 has reached a threshold level, the switch 203 is turned off.

As will be familiar to one skilled in the art, when switch 203 is switched off, the voltage at the non dot end 210 of inductor Lp decreases relative to the voltage at the dot end 211 of inductor Lp and the voltage across switch 204 reduces as the voltage at the output of the half bridge 210 decreases relative to ground rail 214. Since winding L2 is magnetically coupled to inductor Lp, the voltage at the dot end 213 of L2 becomes positive with respect to the voltage at the non dot end 212 of L2. This voltage across L2 is sensed by the low side control circuit 202 and the low side switch 204 is turned on. The on time period of the low side switch is in turn determined by the value of C6 which is charged with a constant current until the voltage across C6 reaches a threshold level at which point the low side switch 204 is turned off.

As will be known to one skilled in the art having the benefit of this disclosure, the voltage across inductor Lp then changes polarity and the winding L1 coupled to the high side integrated circuit 206 provides a turn on drive signal to the high side control circuit 201, in the way described above with L2 and the low side control circuit 202, and the sequence repeats. In the circuit shown in FIG. 2, the windings L1 and L2 also provide the supply current to the integrated circuits 206 and 207, respectively. Other aspects of the converter circuit 200 operation, necessary for the correct operation but not critical to the disclosure of the present invention are not discussed.

Other possible circuit configurations include a variation on the circuit of FIG. 2 where the operation is truly resonant wherein the high side and low side switches are turned off only when the voltage polarity across the inductively coupled drive signal windings L1 and L2 changes due to the resonant frequency of the LC resonant circuit of inductor Lp and capacitors C2 and C3. However, the need to generate drive signals using inductively coupled windings such as L1 and L2 remains unaltered and this configuration is therefore not discussed in detail so as not to obscure the teachings of the present invention.

Figure 3:
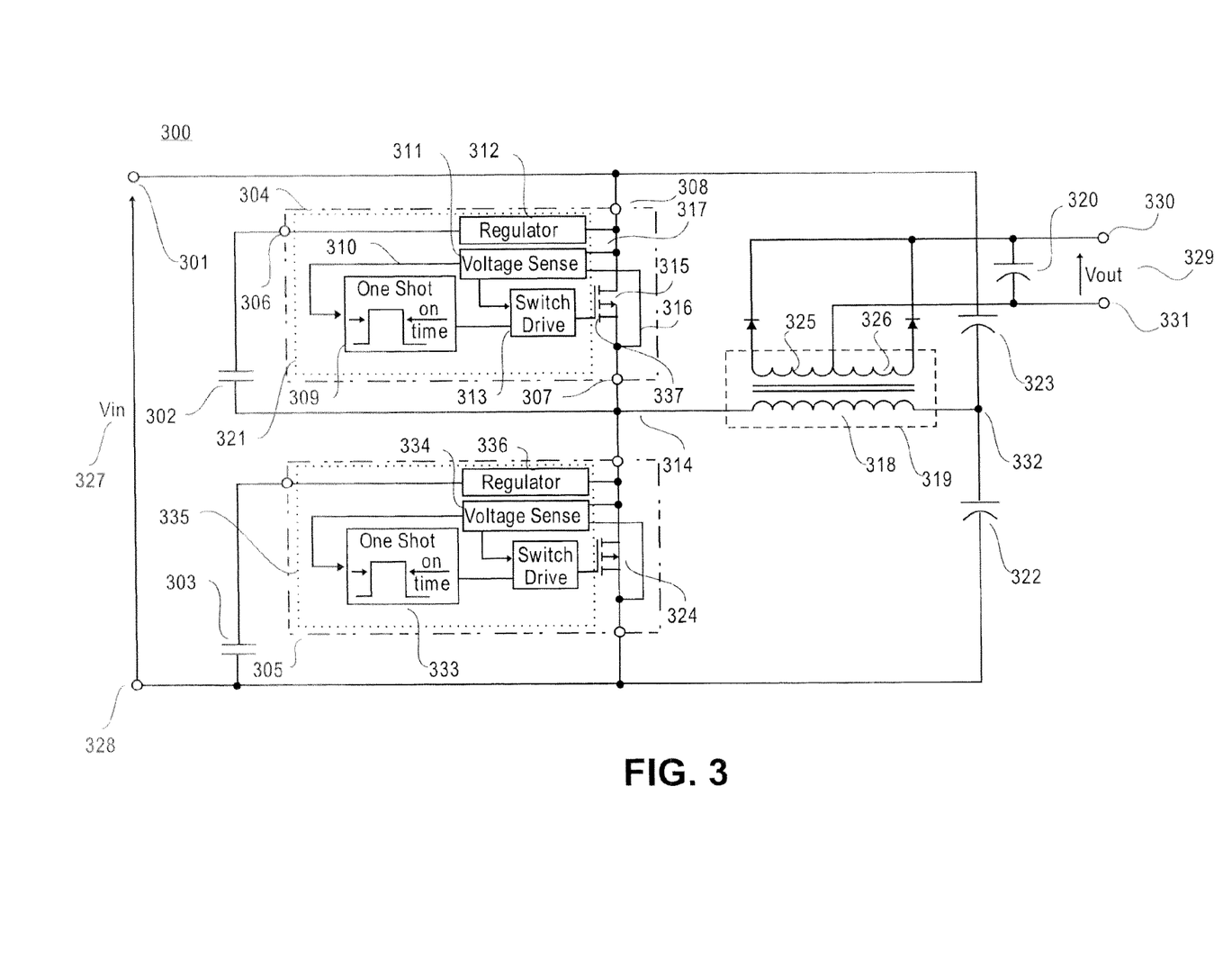
FIG. 3 is one embodiment of a simplified control circuit to control a switch in accordance with the teachings of the present invention.

FIG. 3 shows one embodiment of a circuit benefiting from the teachings of the present invention. The circuit shown is a half bridge power conversion circuit 300. The high side and low side control circuitry and switches are shown as high side and low side integrated circuits 304 and 305, respectively. The switches 315 and 324 are shown as MOSFETs in the circuit of FIG. 3 though other types of switch can be used whilst still benefiting from the teachings of the present invention.

Since the internal circuitry is identical in high side and low side integrated circuits 304 and 305, the description below focuses on the high side integrated circuit 305. For the purposes of the description below, the voltage across low side capacitor 322 is assumed to be equal to the voltage across high side capacitor 323, which is assumed to be substantially fixed at a value of Vin/2 where Vin 327 is the voltage across input terminals 328 and 301. Under this condition, and assuming that the voltage across the high side and low side switches 315 and 324 is substantially zero when they are on, the magnitude of the maximum voltage applied across the transformer primary winding 318 is Vin/2 when either high side switch 315 or low side switch 324 are in the on state.

In the illustrated embodiment, the transformer primary winding 318 is magnetically coupled with the output windings 325 and 326. The switch 315 is coupled between the input 301 and the load which, in the circuit of FIG. 3, is the transformer 319 and all circuitry coupled between the transformer output windings 325 and 326 and output terminals 330 and 331 and any circuitry coupled between output terminals 330 and 331. In other embodiments, not discussed here, the load could be a lamp circuit similar to the load 205 of FIG. 2, a motor, a motor winding or other inductive load for example.

The switch 315 has three terminals, a first switch terminal 308, a second switch terminal 307 and a control terminal 337. Since in this description, switch 315 is a high side switch, terminals 308, 307 and 337 could also be referred to as high side switch terminals. The control circuit 321, coupled to the switch 315 control terminal 337, includes switch drive circuit 313, one shot circuit 309 and voltage sense circuit 311. The operation of the circuit is described below.

For the purposes of this description, it is helpful to begin at an initial condition where switch 315 is off, 324 is on and current is flowing through winding 318 from node 332 to node 314. At the end of the on time period of switch 324, the duration of which is determined by one shot circuit 333, the switch 324 is turned off. Prior to switch 324 turning off, the voltage across switch 315 is substantially equal to Vin according to the description above.

When the switch 324 turns off, the combination of leakage and magnetizing energy stored in the leakage and magnetizing inductance of winding 318, causes the voltage at node 314 to rise with respect to terminal 328, as will be known to one skilled in the art having the benefit of this disclosure. As the voltage at node 314 rises relative to terminal 328, the voltage across switch 315 drops. This voltage is sensed by voltage sense circuit 311. When the voltage sense circuit 311 senses the voltage across the switch 315 (across terminals 307 and 308) falls below a threshold value, the switch 315 is turned on by the control circuit 321 for an on time period. In one embodiment the on time period is substantially fixed. This threshold value can be defined during the manufacture of the integrated circuit 304 or made to be adjustable by the user of integrated circuit 304 with circuitry not shown in FIG. 3.

In one embodiment, the switch 315 is not necessarily turned on immediately when the voltage across switch 315 falls below the threshold value. For instance, a delay time can be set within control circuitry 321, for example within the voltage sense circuit 311, to delay the switch 315 from turning on for a delay time. This delay time provides a minimum time between the time at which switch 324 turns off and the time when switch 315 turns on. This type of delay is typically used in half bridge configurations of the type shown in FIG. 3 to avoid risk of high currents flowing through switches 315 and 324 simultaneously. This delay time is often called a deadtime, which will be familiar to one skilled in the art and is therefore not detailed as a separate circuit block in the circuit of FIG. 3.

In one embodiment, the on time period of switch 315 is fixed by the one shot circuit 309. The duration of the on time period can be fixed during the manufacture of integrated circuit 304 or made to be adjustable by the user of integrated circuit 304 with circuitry not shown in FIG. 3. At the end of the on time period of switch 315, the current in transformer winding 318 is flowing from node 314 to node 332.

When the switch 315 is on, the voltage across switch 324 is substantially equal to Vin according to the description above. When the switch 315 turns off, the voltage at node 314 falls with respect to terminal 328. This voltage is sensed by voltage sense circuit 334. As the voltage at node 314 falls relative to terminal 328, the voltage across switch 324 drops. When the voltage sense circuit 311 senses the voltage across the switch 324 falls below a threshold value, the switch 324 is turned on by the control circuit 335 for an on time period. In one embodiment the on time period of switch 324 is substantially fixed. This threshold value again can be defined during the manufacture of the integrated circuit 305 or made to be adjustable by the user of integrated circuit 304 with circuitry not shown in FIG. 3. The operation continues according to the above description. As explained for the high side control circuit 321, the turning on of the switch 324 can be delayed by a delay circuit within the voltage sense circuit 334 to provide dead time between the turn off of switch 315 and turn on of switch 324.

In one embodiment, voltage sense circuit 311 can be designed to continue sensing the voltage across switch 315 while it is in the on state. In this way, fault conditions resulting in very high current flowing through the on resistance of the switch 315 can be detected since under these conditions, the voltage across the switch 315 rises. A second threshold voltage in voltage sense circuit 311 can therefore be set to sense a fault condition of this type and turn the switch 315 from an on state to an off state when the voltage drop across the switch crosses a second threshold, before the end of the on time period defined by one shot circuit 309. Since this is a fault condition, it is also often necessary to define a minimum off time period before the switch is allowed to turn on again which can be set within the control circuitry 321. In one embodiment, operation of low side voltage sense circuit 334 with respect to controlling low side switch 324 can be identical.

In the illustrated embodiment, the voltage sense circuits 311 and 334 eliminate the requirement for inductively coupled windings such as L1 and L2 in FIG. 2. Furthermore, the level shift circuitry contained within circuit block 105 in FIG. 1 is also not necessary. In the embodiment shown, regulator circuit 312, which is part of high side control circuit 321, charges capacitor 302 while switch 315 is in the off state. The energy stored in capacitor 302 is used to provide the energy required by integrated circuit 304 to operate. The regulator circuit 336 forming part of low side control circuit 335 performs a similar function for low side integrated circuit 305. Control circuits benefiting from the teachings of the present invention do not however require internal regulator circuits such as 312 and 336 and the energy required for high side and low side switch operation, stored on capacitors 302 and 303 can be sourced from an external energy source. For example, an external energy source can be connected directly across capacitor 303 to power the low side integrated circuit 305 and the same supply can be used to charge the capacitor 302 through a diode connected between the energy source and the terminal 306, when switch 304 is on, to power the high side integrated circuit 304. This type of circuit, known as a bootstrap circuit, is well known to one skilled in the art and not shown in FIG. 3.

Figure 4:
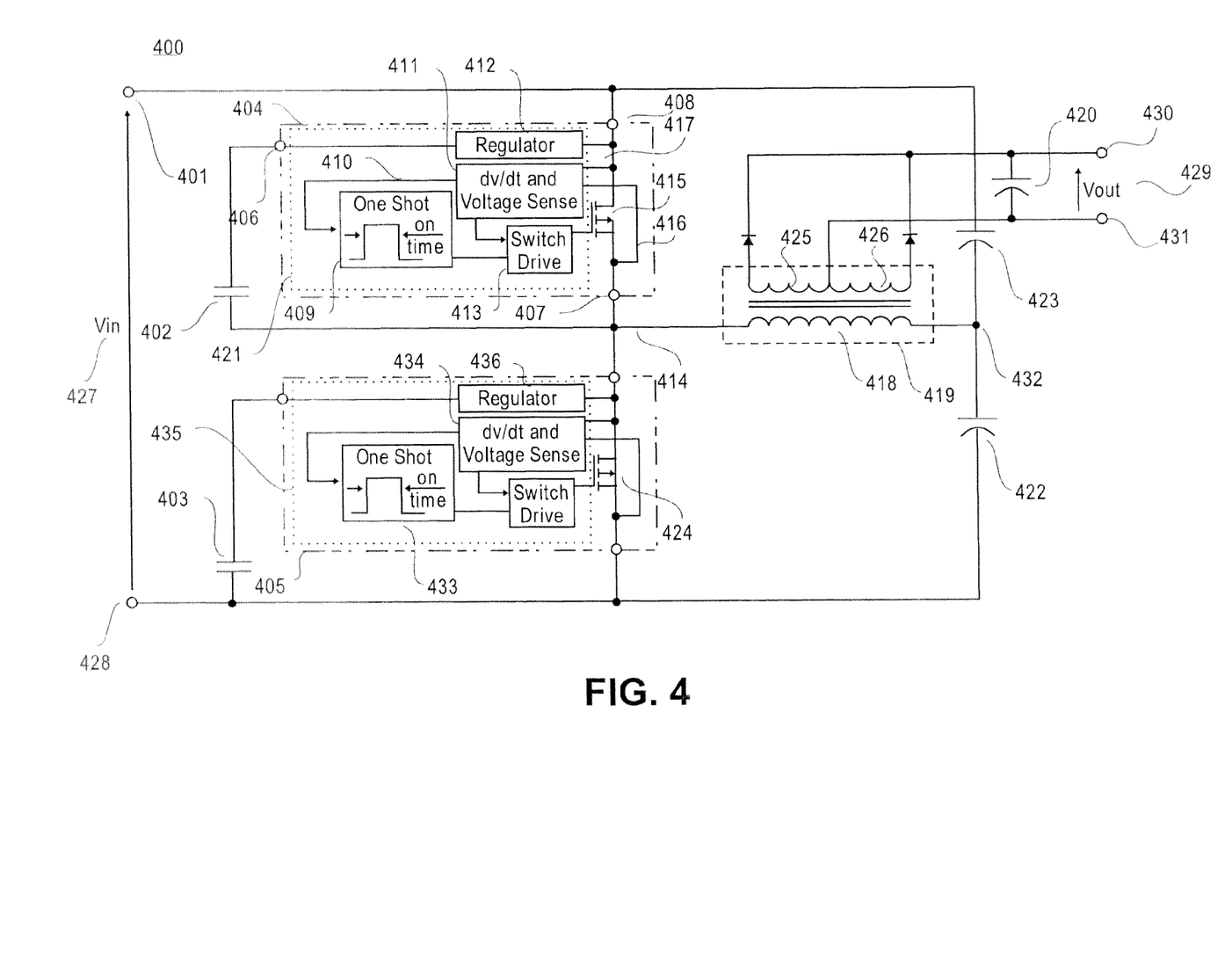
FIG. 4 is another embodiment of a simplified control circuit to control a switch in accordance with the teachings of the present invention.

FIG. 4 shows another embodiment of a circuit benefiting from the teachings of the present invention. Voltage sense circuits 311 and 334 are replaced by dv/dt sense circuits 411 and 434. For clarity the description below focuses on the high side dv/dt sense circuit 411. The operation of low side dv/dt sense circuit 434 can be assumed to be identical.

As shown in the illustrated embodiment, instead of sensing the voltage across switch 415, the dv/dt sense circuit 411 senses the slope of the voltage across switch 415 over time while it is off. By sensing a slope of the voltage across switch 415 in the off state, control circuitry 421 can turn the switch 415 from an off state to an on state when the slope of the voltage across the switch 415 changes. In one embodiment, the dv/dt sense circuits 411 is designed to sense when the slope of the voltage across switch 415 changes polarity while it is in the off state.

A change in polarity of the slope of the voltage across switch 415 while it is off identifies the point where the voltage across switch 415 has reached a minimum and is about to start rising. It is beneficial to sense this point since a switching loss resulting from turning a switch from an off state to an on state is minimized when the voltage across the switch is at a minimum value. All other details such as introducing a delay time between sensing the change in slope of the voltage across the switch and turning a switch on and also sensing of a voltage threshold during the switch on time period to detect fault conditions apply in the same way as described above with reference to FIG. 3 and are therefore not repeated here.

In either the circuit of FIG. 3 or FIG. 4, both low side and high side switches are controlled as a function of the voltage across the switches. In the case of FIG. 3, there is a first threshold voltage detected while the switch is in the off state and used to control the time at which the switch is turned on, and a second voltage threshold used to detect a fault condition during the on time period of the switch. In the embodiment of FIG. 4, the slope of the voltage across the switch is detected while the switch is in the off state and used to control the time at which the switch is turned on, and a voltage threshold used to detect a fault condition during the on time period of the switch.

The circuits of FIGS. 3 and 4 do not show any providing of a feedback control loop from the output terminals 330 and 331 in FIG. 3 and 430 and 431 in FIG. 4 to the high side or low side control circuits. Since the switches of half bridge circuits described in FIGS. 3 and 4 are only controlled as a function of the voltage across the switches, the power delivered to the load can only be regulated by adjusting the input voltages 327 and 427. However, FIG. 5 shows another embodiment of a circuit benefiting from the teachings of the present invention where a feedback control loop is included.

Figure 5:
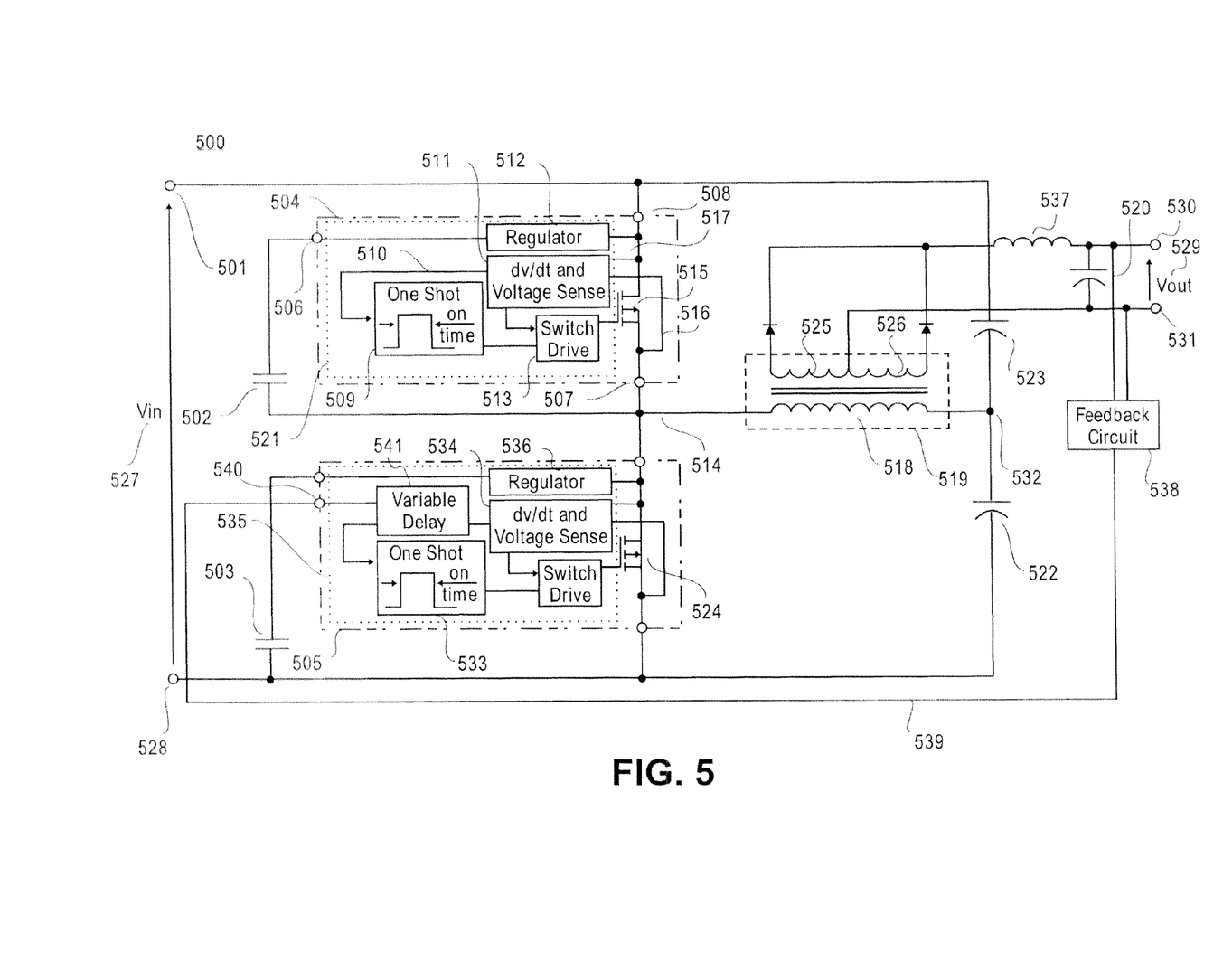
FIG. 5 is yet another embodiment of a simplified control circuit to control a switch in accordance with the teachings of the present invention.

As shown in the embodiment of FIG. 5, a feedback control circuit 538 provides a feedback signal 539, which provides information to the low side integrated circuit 505 regarding an output of the power supply, typically the output voltage 529 or a current flowing in output terminals 530 or 531. In the embodiment of FIG. 5, the feedback signal 539 is coupled to low side integrated circuit 505 through a feedback terminal 540, which then couples to a variable delay circuit 541 internal to the control circuit 535. In other embodiments, the feedback control signal could also be coupled to the high side integrated circuit, which would then include the variable delay circuit instead of the low side integrated circuit.

Taking the same initial condition as used to describe the circuit operation in FIG. 3, when low side switch 524 turns off, the voltage at node 514 rises with respect to terminal 528. In the embodiment shown in FIG. 5, high side control circuit 521 senses the change in slope of the voltage across switch 515 while it is in the off state, though a voltage sense circuit 311 as shown in FIG. 3 could also be used.

After a delay time or deadtime, which is introduced by sense circuit 511, the high side switch 515 is turned on for an on time period that is substantially fixed by one shot circuit 509. When the high side switch 515 turns off, the low side dv/dt sense circuit 534 senses the slope of the voltage across low side switch 524. When the sense circuit 534 provides the signal, which would be coupled directly to the one shot circuits 333 and 433 in FIGS. 3 and 4, respectively, it is instead coupled to a variable delay circuit 541. The variable delay circuit 541 introduces a further delay the length of which is responsive to the feedback signal 539, before one shot circuit 533 is allowed to turn on switch 524.

In one embodiment, the additional delay time introduced by variable delay circuit 541 is used to regulate the power delivered to the load. For example the delay time introduced by variable delay circuit 541 is extended if the feedback circuit 538 provides feedback that less power is required by the load. This additional variable delay time requires that output filter inductor 537 is required to filter the output voltage. The circuits of FIGS. 3 and 4 did not show any output filter inductor of this type since the delay period between switching of high side and low side switches is a fixed delay or deadtime which is normally minimized to reduce ripple in the output voltages 329 and 429. In other embodiments of the circuits of FIGS. 3 and 4, an output filter inductor may also be included depending on the output voltage ripple specifications of a specific circuit.

Figure 6:
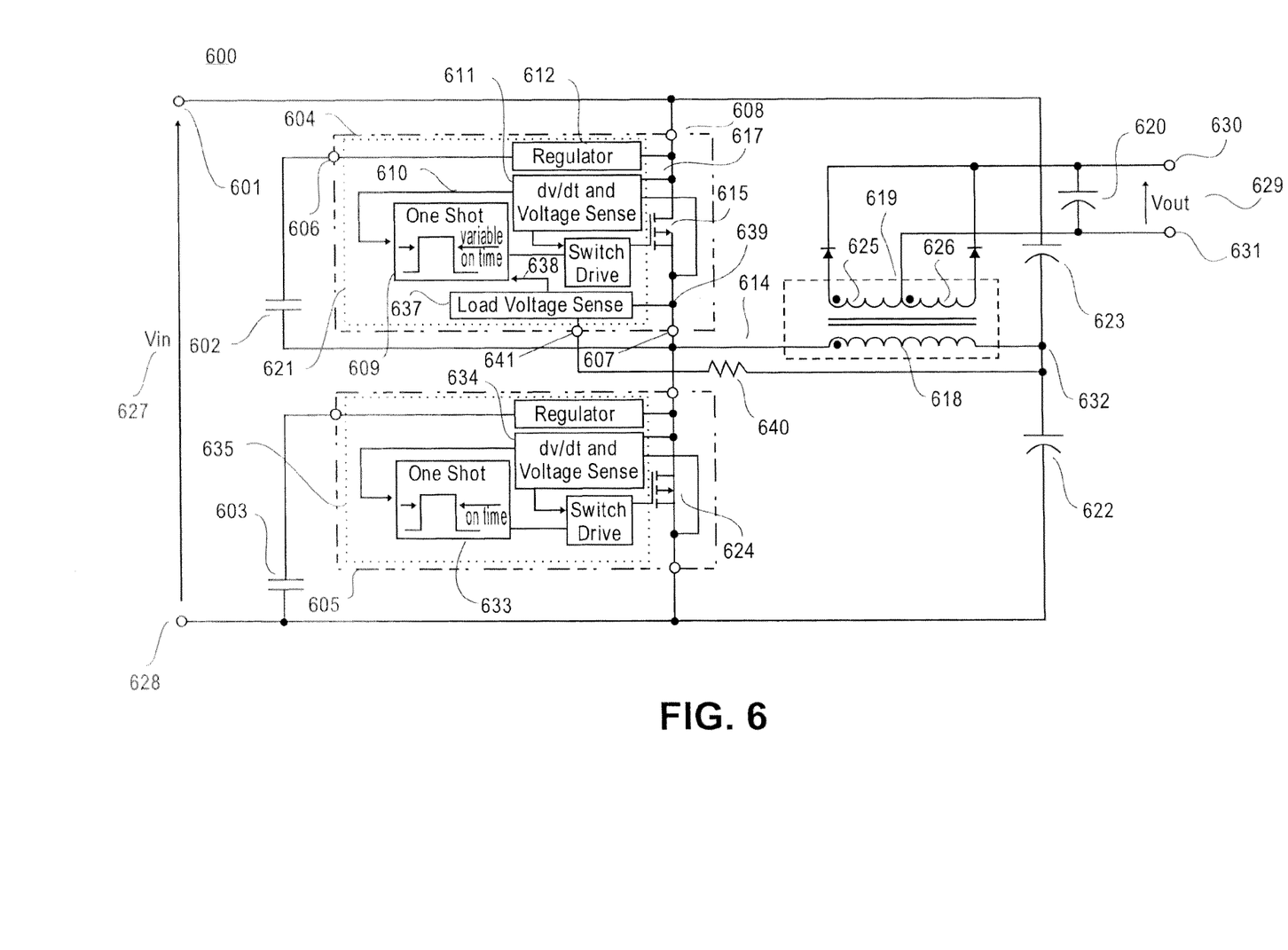
FIG. 6 is still another embodiment of a simplified control circuit to control a switch in accordance with the teachings of the present invention.

FIG. 6 shows another embodiment of a circuit benefiting from the teachings of the present invention. For optimum operation of the power conversion circuit 600, the magnitude of the voltage across the transformer output winding 625 when high side switch 615 is in the on state is substantially equal to the magnitude of the voltage across transformer output winding 626 when low side switch 624 is in the on state. This will minimize output voltage ripple between the high side on time period and low side on time period.

In order for this condition to be satisfied, assuming that the voltage dropped across high side switch 615 when it is in the on state is substantially equal to the voltage dropped across low side switch 624 when it is in the on state, the voltage across high side capacitor 623 is substantially equal to the voltage across low side capacitor 622. In order to meet this condition, the high side integrated circuit 604 includes a load voltage sense circuit 637, which is coupled to receive two inputs. The first input is from node 639, which is coupled to the high side switch terminal 607, which in turn is coupled to the junction of the low side, and high side switches 614. The second input 641 is coupled to the junction 632 of the high side and low side capacitors through resistor 640.

In the illustrated embodiment, the current flowing in resistor 640 is substantially proportional to the voltage across the transformer winding 618, which for the purposes of this description is considered the load. Therefore, in this configuration, the load voltage sense circuit 637 can sense the voltage across the input transformer winding 618, during the high side on time period when node 639 is coupled to the input terminal 601 through high side switch 615. In one embodiment, voltage sense circuit 641 can also sense the voltage across the load 618 during the low side on time period when node 639 is coupled to the input terminal 628 through the low side switch 624.

In order maintain the condition that the voltage across the load during the high side on time period is substantially equal to the voltage across the load during the low side on time period, the high side on time period in one embodiment is varied in response to an output signal 638 from load voltage sense circuit 637, which is coupled to high side one shot circuit 609. It will be known to one familiar in the art having the benefit of this disclosure that by varying the on time period of high side switch 615 in this way, the energy delivered to and hence voltage across capacitor 622 can be controlled to satisfy the requirement that the voltage across the transformer output winding 625 when high side switch 615 is in the on state is substantially equal to the voltage across transformer output winding 626 when low side switch 624 is in the on state.

Figure 7:
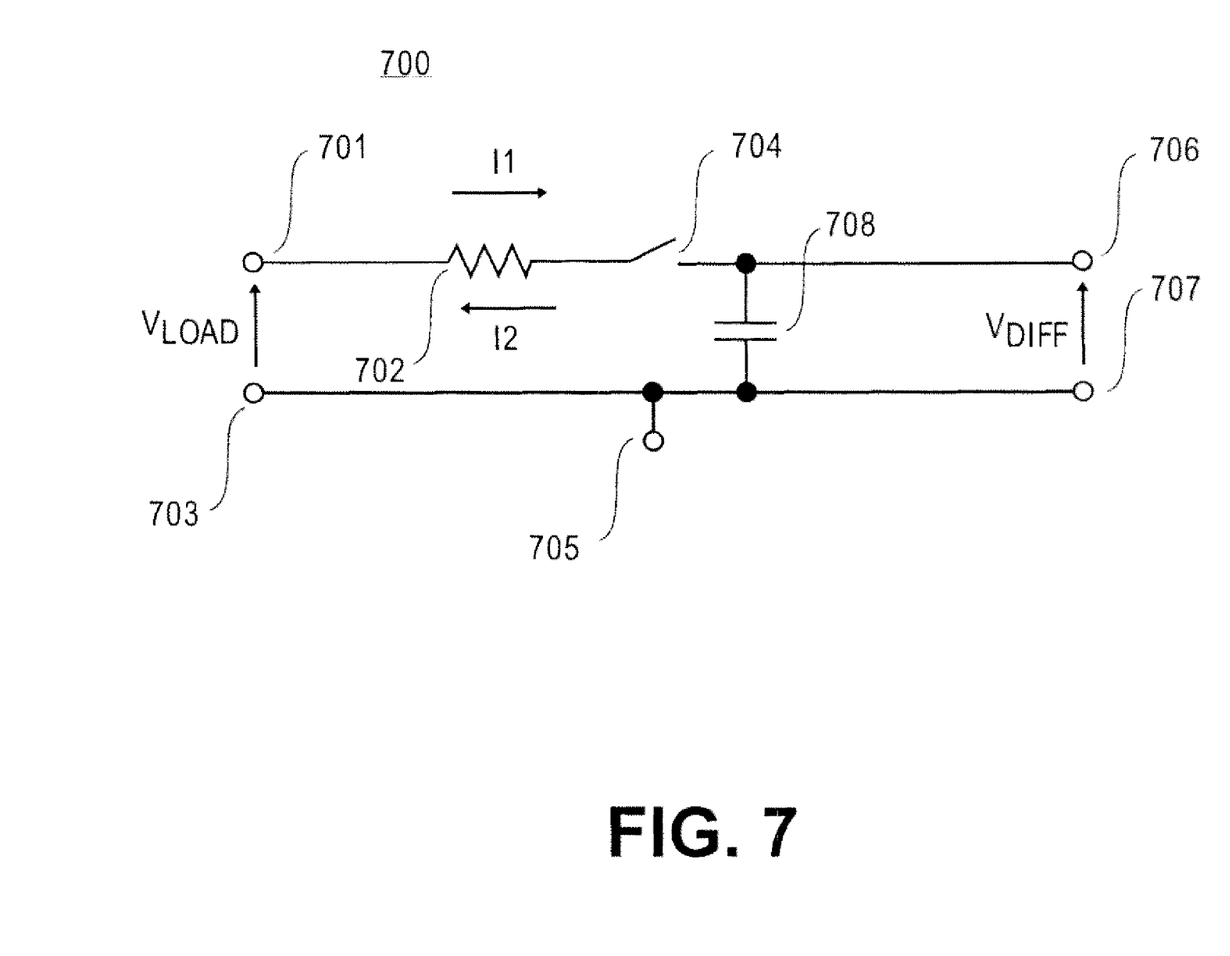
FIG. 7 is a schematic diagram of one embodiment of a voltage sense circuit that could be employed by a simplified control circuit to control a switch in accordance with the teachings of the present invention.

FIG. 7 shows a block diagram of one embodiment of a load voltage sense circuit that will provide an output signal which is varied in response to the relative magnitude of a voltage of a first polarity applied across a load during a first on time period and of the magnitude of an opposite polarity voltage applied across the load during a second on time period. In one embodiment input terminals 701 and 703 are coupled across the load. In one embodiment resistor 702 is equivalent to resistor 640 in FIG. 6. In another embodiment, resistor 702 could form part of load voltage sense circuit 637 in FIG. 6 eliminating the requirement for external resistor 640.

In the illustrated embodiment, during the first on time period, for example the on time period of high side switch 615, a first sense period is initiated when switch 704 is switched on. The magnitude of current I1 flowing in resistor 702, which is a sense signal, is substantially proportional to the magnitude of the voltage across the load, which is applied as input voltage $V_{LOAD}$ between terminals 701 and 703. The current I1 charges capacitor 708 relative to a voltage reference terminal 705, which in one embodiment could be equivalent to terminal 607. At the end of the first sense period, switch 704 is switched off.

During the second on time period, for example the on time period of low side switch 624, a second sense period is initiated when switch 704 is again switched on. The magnitude of current I2 which is a sense signal, is a function of the magnitude of the voltage across the load during the during the second sense period. The current I2 discharges capacitor 708 relative to reference voltage terminal 705.

If first and second sense periods are substantially equal in duration, the voltage Vout across output terminals 706 and 707 is substantially proportional to a difference in the magnitude of the voltage across the input terminals 701 and 703 during the first on period and the voltage across the input terminals 701 and 703 during the second on period. In one embodiment, the voltage at terminal 706 relative to terminal 707 is equivalent to output signal 638 relative to terminal 607 in FIG. 6.

In the illustrated embodiment, the first and second sense periods are usually initiated sometime after the beginning of the first and second on time periods respectively in order that ringing voltages and other transient conditions, which occur at the time when a switch is first switched to an on state, have decayed to substantially zero, in order that accurate sensing can be achieved during the first and second sense periods. Such transient conditions following the switching to an on state will be familiar to one skilled in the art. In one embodiment, the second sense period is initiated sometime after the turn off of the high side switch 615 to allow sufficient time for the low side switch to turn-on and the transients to decay to substantially zero condition. The output signal $V_{DIFF}$ out of circuit 700 can be filtered as required to provide a signal responsive to difference between the two polarities of voltage across the load.

In the foregoing detailed description, the present invention has been described with reference to specific exemplary embodiments thereof. It will, however, be evident that various modifications and changes may be made thereto without departing from the broader spirit and scope of the present invention. The present specification and figures are accordingly to be regarded as illustrative rather than restrictive.

What is claimed is:

1. A circuit, comprising:
   a high side switch coupled between a positive input terminal and a first terminal of a primary transformer winding;
   a low side switch coupled between a negative input terminal and the first terminal of the primary transformer winding;
   a first control circuit coupled to the high side switch, the positive input terminal and the first terminal of the primary transformer winding, the first control circuit coupled to sense a voltage across the positive input terminal and the first terminal of the primary transformer winding to control the high side switch in response to the sensed voltage across the positive input terminal and the first terminal of the primary transformer winding; and
   a second control circuit coupled to the low side switch, the first terminal of the primary transformer winding and the low side input terminal, the second control circuit coupled to sense a voltage across the first terminal of the primary transformer winding and the low side input terminal to control the low side switch in response to the sensed voltage across the first terminal of the primary transformer winding and the low side input terminal.

2. The circuit of claim 1 wherein the first control circuit is adapted to turn the high side switch on for an on time period by generating a pulse having a pulse width of the on time period when the first control circuit senses the voltage across the high side switch crosses below a first threshold while the high side switch is off.

3. The circuit of claim 2 wherein the on time period is substantially fixed.

4. The circuit of claim 1 wherein the first control circuit is adapted to turn off the high side switch before an end of an on time period if the first control circuit senses that the voltage drop across the high side switch crosses above a second threshold.

5. The circuit of claim 4 wherein the first control circuit is adapted to turn off the high side switch for a minimum off time period before the first control circuit turns the high side switch on again.

6. The circuit of claim 2 wherein the first control circuit is adapted to delay the high side switch from being turned on for a delay time after the voltage across the high side switch crosses below the first threshold while the high side switch is off.

7. The circuit of claim 1 wherein the primary transformer winding is included in a transformer having secondary windings.

8. The circuit of claim 7 wherein the transformer includes a second terminal of the primary terminal winding that is capacitively coupled to the positive input terminal and is capacitively coupled to the negative input terminal.

9. The circuit of claim 1 wherein the high side switch is included in an integrated circuit.

10. The circuit of claim 1 wherein the circuit is included in an integrated circuit.

11. The circuit of claim 1 wherein the circuit is included in a power conversion circuit.

12. The circuit of claim 1 wherein the high side switch is a metal oxide semiconductor field effect transistor (MOSFET).

13. The circuit of claim 1 wherein the first control circuit is adapted to turn the high side switch on for an on time period when the first control circuit senses a change in a slope of the voltage across the high side switch over time while the high side switch is off.

14. The circuit of claim 1 wherein the low side switch is turned on after a delay time for a low side on time period when the voltage across the low side switch crosses below a low side threshold while the low side switch is off.

* * * * *